United States Patent [19]

Miyazaki et al.

[11] Patent Number: 5,503,732

[45] Date of Patent: Apr. 2, 1996

[54] METHOD FOR MANUFACTURING A SUBSTRATE HAVING WINDOW-SHAPED AND FRAME-SHAPED COATING FILMS ON THE SURFACE THEREOF

[75] Inventors: Susumu Miyazaki, Ibaraki; Tsuyoshi Nakano, Funabashi; Yoshikatsu Okada, Chiba; Yasuhiko Teshima, Yachiyo; Miki Matsumura, Tokyo, all of Japan

[73] Assignee: Shinto Paint Co., Ltd., Amagasaki, Japan

[21] Appl. No.: 273,967

[22] Filed: Jul. 12, 1994

[30] Foreign Application Priority Data

Jul. 26, 1993 [JP] Japan .................................. 5-183796

[51] Int. Cl.$^6$ ........................................................ C25D 7/00
[52] U.S. Cl. .................... 205/122; 205/135; 205/159; 205/162; 205/164; 205/188; 205/209; 205/221; 205/229; 205/317
[58] Field of Search ................................ 205/50, 52, 55, 205/122, 135, 162, 164, 188, 209, 221, 229, 317, 159

[56] References Cited

U.S. PATENT DOCUMENTS

| | | | |
|---|---|---|---|
| 4,311,773 | 1/1982 | Kaneko et al. | 430/7 |
| 4,617,094 | 10/1986 | Kamamori et al. | 204/18.1 |
| 4,812,387 | 3/1989 | Suzuki et al. | 430/311 |
| 4,873,175 | 10/1989 | Suzuki et al. | 430/311 |
| 4,902,592 | 4/1990 | Matsumura et al. | 205/135 |

FOREIGN PATENT DOCUMENTS

| | | |
|---|---|---|
| 0154556 | 9/1985 | European Pat. Off. . |
| 243121 | 10/1987 | European Pat. Off. . |
| 0340968 | 11/1989 | European Pat. Off. . |
| 0478321 | 4/1992 | European Pat. Off. . |

OTHER PUBLICATIONS

*Database IBM–TDB*, Anonymous, "Liquid Crystal Display" & *IBM Technical Disclosure Bulletin*, vol. 35, No. 3, Aug. 1992, New York, U.S., pp. 109–110.

*Primary Examiner*—John Niebling
*Assistant Examiner*—Edna Wong
*Attorney, Agent, or Firm*—Stevens, Davis, Millier & Mosher

[57] ABSTRACT

A method for manufacturing a substrate useful as a color filter for LCD and having window-shaped coating films and a frame-shaped, functional coating film at the regions not occupied with the window-shaped coating films, which comprises the steps of:

(a) forming a functional coating film on a transparent substrate having electrically conductive circuits on a surface thereof, (b) superposing a photomask having a predetermined pattern on the surface of the coating film formed in step (a), and exposing the thus masked coating film to light, (c) subjecting the intermediate product to developing to leave a frame-shaped coating film, and (d) subjecting the resulting substrate formed through steps (a) to (c) to electro-deposition to form electro-deposition coating films on the electrically conductive circuits, enables production of coating films of fine pattern with improved precision.

9 Claims, 2 Drawing Sheets

METHOD FOR MANUFACTURING A SUBSTRATE HAVING WINDOW-SHAPED AND FRAME-SHAPED COATING FILMS ON THE SURFACE THEREOF

The present invention relates to a method for manufacturing a substrate having on the surface thereof window-shaped coating films and a frame-shaped, functional coating film having light-screening properties at the regions not occupied with the window-shaped coating films. The method of the present invention is particularly useful for producing a color filter used in a color liquid crystal display (LCD), which has window-shaped, colored coating films and a frame-shaped coating film having a function of screening unnecessary lights or achieving other desirable properties. This method is particularly useful for production of a color filter, which is used in a matrix type color display formed using a thin film transistor (TFT) and a color filter.

Liquid crystal displays have so far been used for goods with a small-sized display such as the so-called pocket-sized television. However, the size of liquid crystal displays has rapidly been enlarged in recent years. The image quality of liquid crystal displays has also been improved by the development from TN liquid crystals to STN liquid crystals and active driving elements exemplified by TFT, which has enabled the commercialization of goods with a liquid crystal display having as high image quality as cathode-ray tubes. Various studies have been conducted for improving the image quality and productivity of the color displays using TFT. Of these studies, the method for forming a light screening film called a black matrix that prevents light leakage toward TFT and improves the image quality (apparent contrast) and the shape of the light screening film are of great concern.

As the method for forming a frame-shaped, functional film at the regions not occupied with colored, window-shaped films for the production of a color filter used for colorization of LCD, there are known methods utilizing printing techniques such as silk screen method, offset method, etc.

There is also known a method for forming a functional coating film as a black matrix in the gaps of stripe-form colored coating films, which comprises forming stripe-form colored coating films on a plurality of parallel stripe-form conductive circuits arranged on a transparent substrate by an electro-deposition method; forming a negative photoresist film capable of giving a functional coating film on the whole surface of the substrate so as to cover the stripe-form colored coating films; exposing the photoresist film to light from the opposite side of the photoresist-carrying surface of the substrate so that the stripe-form colored coating films function as a mask; and eliminating the uncured photoresist film. (JP-A-62-247331).

For TFT type liquid crystal displays which are considered promising in recent years, the improvement of light screening capacity of the light screening film is required in order to prevent light leakage toward a switching element. Also, for the sake of improvement in image quality, the light screening film has often become demanded to have a complicated pattern such as lattice form, etc.

However, conventional methods for forming a frame-shaped, functional film utilizing printing techniques are disadvantageous in that they cannot provide a functional coating film of high precision. For example, when a lattice form functional film is formed by the conventional methods, the film formed has a coarse pattern in which the lattice gap is about 100 μm.

On the other hand, the method disclosed in JP-A-62-247331 enables formation of a functional coating film between the stripe-form colored coating films with high precision; however, they have a problem that a functional coating film is difficult to be formed in the transverse direction of the stripe-form colored coating films to obtain a lattice form.

Thus, it is an object of the present invention to solve the above-mentioned problems of prior art by providing an industrially advantageous method for manufacturing a substrate particularly useful as a color filter for LCD, and having window-shaped coating films and a frame-shaped, functional coating film having light-screening and other desirable properties at the regions not occupied with the window-shaped coating films particularly with high precision and fine pattern such as window width of less than 100 μm.

Having taken notice that coating films can be formed only on conductive circuits selectively with high precision by the electro-deposition method, the present inventors have extensively studied, and as a result the present invention has been accomplished.

BRIEF DESCRIPTION OF THE DRAWINGS

FIG. 1A, is a transparent substrate having electrically conductive circuits; FIG. 1B is an intermediate product carrying a photoresist film formed through step (a); FIG. 1C is an intermediate product formed through steps (b) and (c); and FIG. 1D is a product carrying an electro-deposited coating film formed through step (d); wherein 1 is a transparent substrate, 2 is an electrically conductive circuit, 3 is a photoresist film, 4 is a window-shaped vacant hole, 7 is a coating film (red) formed in the window-shaped vacant hole, 8 is a coating film (green) formed in the window-shaped vacant hole, and 9 is a coating film (blue) formed in the window-shaped vacant hole.

In FIG. 2A, is a pattern of the electrically conductive circuits; FIG. 2B is a pattern of the frame-shaped functional coating film formed through steps (a), (b) and (c); and FIG. 2C is a pattern of the window-shaped, electro-deposited coating film formed through step (d); wherein 2 is an electrically conductive circuit, 5 is a coating film formed in the window-shaped hole, and 6 is a frame-shaped coating film.

DETAILED DESCRIPTION OF THE INVENTION

Figure 1A:
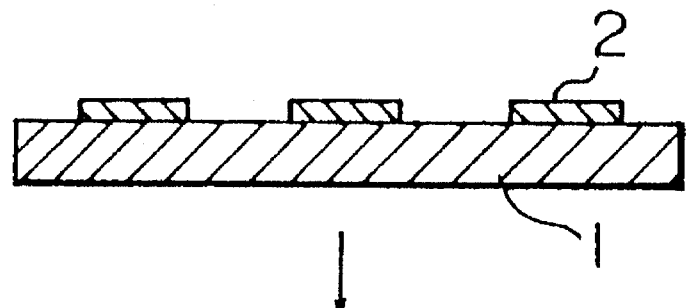
FIGS. 1A–1D are a cross-sectional schematic view illustrating the products formed through respective steps of the method of the present invention.
Figure 1B:
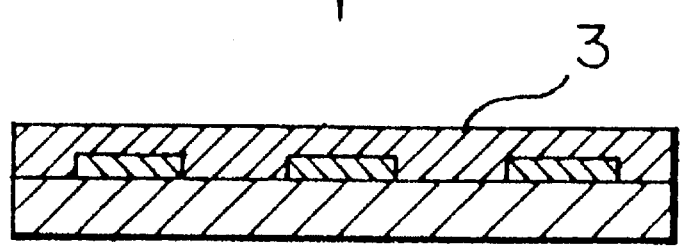
Figure 1C:
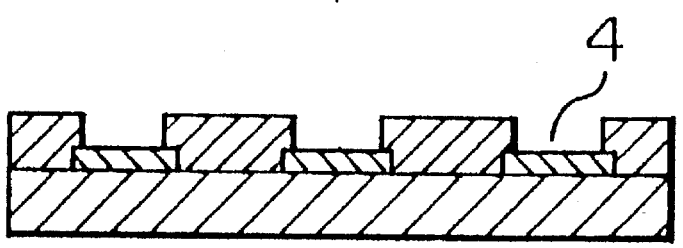
Figure 1D:
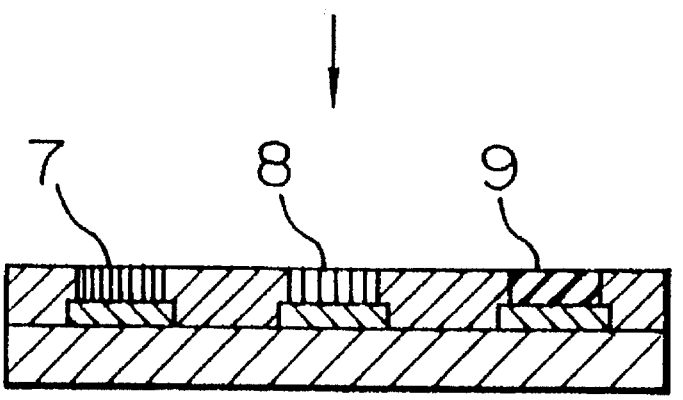

The present invention provides a method for manufacturing a substrate having electrically conductive circuits on the surface thereof, window-shaped coating films on the circuits and a frame-shaped, functional coating film at the regions not occupied with the window-shaped coating films, which comprises the steps of:

(a) coating a transparent substrate having electrically conductive circuits on the surface thereof with a negative or positive photoresist composition capable of giving a functional coating film to cover the circuits-carrying surface of the substrate, followed by forming a functional coating film, (b) superposing, on the surface of the coating film formed through step (a), a photomask having a pattern designed so as to give in the following step (c) the coating film covering the frame-shaped part and uncovering the window-shaped parts, and exposing the thus masked coating film to light, (c) subjecting the resulting substrate formed through steps (a) and (b) to development, leaving the frame-shaped coating film and eliminating the coating film other than the frame-shaped coating film, and (d) subjecting the resulting substrate formed through steps (a), (b) and (c) in this order to electro-deposition using the circuits on the substrate as one electrode, forming electro-deposition coating films at the window-shaped parts on the circuits.

In the present invention, the window parts and frame part may have any plan shape. For example, the shape of frame part may be any of the parallel lattice form shown in FIGS. 2A–2C and other modified lattice forms.

The transparent substrate which can be used in the present invention includes glass boards, plastic boards and the like. The conductive circuit formed on the substrate is prepared from a transparent conductive material such as ITO film (tin-doped indium oxide film), NESA film (antimony-doped tin oxide film) and the like, according to a conventional method.

Step (a) of the present invention is a step of coating the substrate having electrically conductive circuits on the surface thereof with a negative or positive photoresist composition capable of giving a functional coating film to cover the circuits-carrying surface of the substrate, followed by forming a functional coating film.

Examples of the negative photoresist composition used in step (a) include those prepared by adding a photopolymerization initiator such as benzophenes, anthraquinones and the like to an acrylate resin, etc. Commercially available negative photoresist compositions are CK2000 (trade name, containing a black colored pigment) manufactured by Fuji Hant Electronics Technology Co., V-259-PA (trade name) manufactured by Shin-Nittetsu Kagaku Co., etc.

Examples of the positive photoresist composition which can be used herein include the product prepared by adding an esterified product of o-quinonediazide to novolac type phenolic resin and the like. Commercially available positive photoresist compositions are OFPR-800 (trade name) manufactured by Tokyo Ohka Co., Ltd., PF-7400 (trade name) manufactured by Sumitomo Chemical Co., Ltd., FH-2030 (trade name) manufactured by Fuji Hant Electronics Technology Co., etc.

If desired, a pigment giving light screening properties, an adhesiveness-imparting material, etc. may be added to these negative and positive photoresist compositions.

As the method for coating the negative or positive photoresist composition on the surface of the substrate having conductive circuits, screen printing method, offset printing method, roll coating method, bar coating method, spin coating method, etc. can be adopted. Among these, the spin coating method is recommendable because of high fidelity and high precision.

In carrying out the spin coating, it is preferred to change the whirler in two stages in a manner such that the photoresist composition is spread on a substrate at 100–400 rpm in the first stage, and thickness of the photoresist composition is made even at 800–5,000 rpm in the second stage.

The negative or positive photoresist composition coated on the substrate having conductive circuits is subsequently heat-treated preferably at 60°–100° C. for 5–60 minutes, thereby forming the coating film. By this heat-treatment, the resin in the negative or positive photoresist composition is preliminarily cured, and the adhesion to the substrate having conductive circuits is improved.

In the present invention, step (b) is a step of superposing, on the surface of the coating film formed through step (a), a photomask with a pattern designed so as to give in the following step (c) the coating film covering the frame-shaped part and uncovering the window-shaped parts, and exposing the thus masked coating film to light.

When the film is formed using the negative photoresist composition, an oxygen barrier may be applied on the coating film before the exposure to light in consideration of the kind of photoresist composition, if desired. As examples of the oxygen barrier, CP Solution (trade name) manufactured by Fuji Hant Electronics Technology Co. and the like can be referred to.

In the exposure of step (b), lights of various wavelength ranges can be used depending on the kind of negative or positive photoresist composition used. Generally speaking, lights of ultraviolet region are desirable. As the light source, the apparatuses using super-high pressure mercury lamp, metal halide lamp and the like can be used. From the viewpoint of precision of patterning, those apparatuses which have a mirror type parallel light structure are preferred.

The conditions of exposure are depending on the light source and the kind of photoresist composition used. In the case of the film formed using the negative photoresist composition, the light exposure is usually in the range of 10–500 mJ/cm$^2$. The film not exposed to light is not cured, so that it keeps soluble in a developing agent mentioned below.

In the case of the film formed using the positive photoresist composition, the light exposure is usually in the range of 10–500 mJ/cm$^2$. In the film exposed to light, a degradation reaction progresses, so that the film becomes soluble in a developing agent mentioned below.

Step (c) of the present invention is a step of subjecting the resulting substrate to development to leave the frame-shaped coating film and eliminate the coating film other than the frame-shaped coating film.

In the case of the film formed using the negative photoresist composition, the unexposed portion is uncured and eliminated. The elimination of unexposed portion can be carried out using a developing agent. The agent may be selected from various ones depending on the kind of the negative photoresist composition used. Examples thereof are aqueous alkaline solutions of caustic soda, sodium carbonate, quaternary ammonium salt, organic amines and the like, and organic solvents such as esters, ketones, alcohols, aromatic hydrocarbons, chlorinated hydrocarbons and the like. The elimination can be effected by dipping or showering the substrate in or with the developing agent in a period of from about 5 seconds to about 3 minutes. Subsequently, the residual undeveloped coating film is thoroughly rinsed with city water, deionized water or the like, and if necessary, it is heat-treated at 80°–280° C. for 5–60 minutes.

In the case of the film formed using the positive photoresist composition, the exposed portion is degraded and eliminated. The elimination of exposed portion can be effected in a developing manner similar to that mentioned above.

Figure 2A:
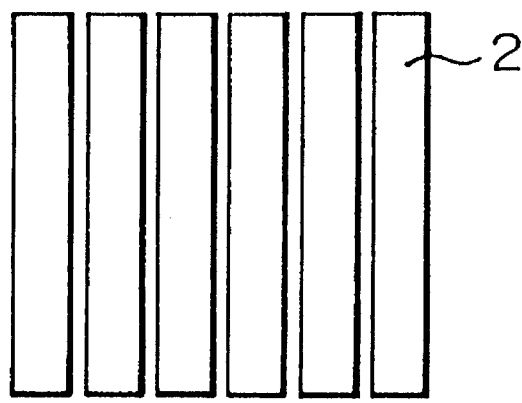
FIGS. 2A–2C are a schematic plan view illustrating respective patterns of the electrically conductive circuits, the frame-shaped functional coating film and the window-shaped coating film.
Figure 2B:
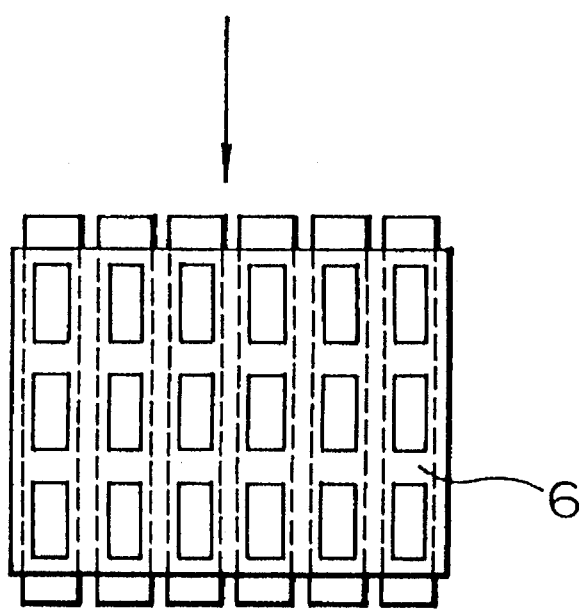
Figure 2C:
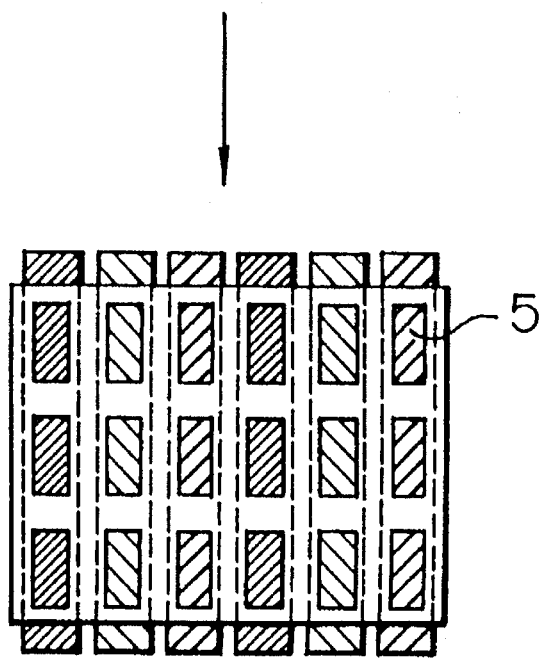

Through these steps, a functional coating film can be formed using the negative or positive photoresist composition in a desired frame shape depending on the photomask pattern used in step (b). FIGS. 2A–2C illustrates one example of the pattern shape of the coating film formed herein.

Step (d) of the present invention is a step of subjecting the substrate formed through steps (a) to (c) in this order to electro-deposition using the electrically conductive circuits on the substrate as one electrode to form electro-deposition coating films at the window-shaped parts on the electrically conductive circuits. The methods of electro-deposition on this sort of conductive circuits are generally well known. For example, the descriptions of Jitsumu Hyomen Gijutsu (Metal Finishing Practice), Vol. 34, No. 6 (1987), pp. 57–63 and JP-B-4-64875 can be referred to. This method includes anionic and cationic coating methods. Although the anionic and cationic coating methods are both usable in the present invention, anionic electro-deposition coating method is preferable to the cationic one because of smaller influence on the circuits. A resin material (binder) used in the electro-deposition includes, for example, maleinated oil type, acrylic type, polyester type, polybutadiene type and polyolefin type resin materials. These materials may be used either singly or in the form of mixture. Into the binder, pigment and other materials used in the conventional electro-deposition are appropriately compounded.

An electro-depositing solution is usually prepared by dispersing the ingredients such as binder, etc. in water, followed by dilution. The electro-depositing solution is not limited to such water-dilution type of ones, but nonaqueous electro-depositing solutions using organic solvents are also usable.

The intermediate product formed through the above-described steps (a) to (c) is introduced into a bath containing the electro-depositing solution. In the case of anionic electro-deposition, the conductive circuits on the substrate are used as positive electrode, and a corrosion-resistant conductive material (for example, stainless steel and the like) is introduced as a counter electrode, and then a direct current voltage is applied. Thus, an electric current passes between the conductive circuits and counter electrode, with a simultaneous formation of an electro-deposition coating film on the window parts of the conductive circuits. Thickness of the film can be regulated by altering the conditions of electro-deposition. Usually, the period of electro-deposition is from about 1 second to about 3 minutes at 10–300 V. After formation, the electro-deposited coating film is thoroughly washed until unnecessary materials have been removed therefrom. In order to enhance the strength of coating film, the film may be heat-treated, if necessary, at 10°–280° C. for 10–120 minutes.

In the case of producing the substrate for the purpose of production of a color filter for use in LCD, the electro-deposited coating films are colored with three primary colors (red, green and blue). For forming a coating film of desired color on a desired window part, the electro-deposition can be performed by appropriately selecting the coloring agent incorporated in the electro-deposition bath and conductive circuits to which voltage is applied.

Through all steps described above, window-shaped coating films on the conductive circuits can be formed through step (d) and a frame-shaped functional coating film at the regions not occupied with the window-shaped coating films can be formed through steps (a) to (c).

In producing a color filter for use in LCD, etc., the coating films of window parts and the functional coating film of frame part are formed on the transparent substrate by the method of the present invention, and thereafter an overcoat film (protecting film) is formed on both coating films. As material of the overcoat, epoxy, polyimide and acrylate resins and the like are used. The overcoat film can be formed by applying the resin by means of spin coater, roll coater or the like and thermally baking the resin. Further thereon is formed a transparent conductive film as electrode for driving liquid crystal, and if desired a circuit pattern is formed to complete a color filter.

The present invention is illustrated in detail by referring to Examples which are only illustrative.

EXAMPLE 1

(1) Formation of stripe-form transparent conductive circuits on transparent substrate On a glass substrate having a thickness of 1.1 mm, ITO circuits (sheet resistance: 15 $\Omega/\square$) having a width of 80μm were formed in parallel and rectilinearly at intervals of 20μm (100μm pitch).

(2) Formation of functional coating film

On the whole surface of the transparent substrate having electrically conductive circuits thereon obtained in (1), a mixture prepared by adding 20 parts by weight of ethyl cellosolve acetate to 100 parts by weight of a negative photoresist composition (trade name CK20000, manufactured by Fuji Hant Electronics Technology Co., containing a black pigment) was spin-coated in two stages, namely firstly at 200 rpm/10 seconds and secondly at 800 rpm/30 seconds. The resulting coat was heat-treated at 85° C. for 5 minutes to form a black-colored coating film having a film thickness of 1.4μm. These procedures illustrates step (a) of the present invention.

(3) Formation of oxygen barrier film

On the coating film formed in (2), an oxygen barrier film was formed by spin-coating using CP Solution (manufactured by Fuji Hant Electronics Technology Co.) in two stages, namely firstly at 200 rpm/10 seconds and secondly at 800 rpm/60 seconds, and heat-treating the coat at 85° C. for 5 minutes.

(4) Exposure to light

On the oxygen barrier film formed on the coating film, a lattice-wise patterned photomask having light-screening window parts of one window size of 60 μm ×200 μm was aligned with the under transparent conductive circuit pattern (line/space: 80 μm/20 μm) so as to locate the window parts on the circuit line. The gap between the photomask and the oxygen barrier film was 30 μm. Then, the resulting product was exposed with Proximity Exposing Machine (trade name MAP-1200, manufactured by Dainippon Kaken Co.) using a super-high pressure mercury lamp as light source, at a light exposure of 50 mJ/cm$^2$. After the exposure, the product was heat-treated at 85° C. for 5 minutes. These procedures illustrates step (b) of the present invention.

(5) Development

Subsequently, the product of (4) was dipped in pure water to dissolve out the oxygen barrier film. Then, the product freed from the oxygen barrier film was immersed for 5 minutes in a developing solution prepared by diluting 1 part by weight of CD Solution (trade name, manufactured by Fuji Hant Electronics Technology Co.) with 10 parts by weight of water to eliminate the unexposed window parts. Then, the product was rinsed with deionized water and air-dried. Thereafter, a heat-treatment was carried out at 230° C. for 20 minutes to form a lattice-form coating film (black colored, light-screening). These procedures illustrates step (c) of the present invention.

(6) Formation of electro-deposited film

Using prescribed transparent conductive circuits on the transparent substrate as one electrode, electro-deposition was carried out in order of red, green and blue coatings. As the electro-deposition coating materials, aqueous solutions of anionic polyester resin in which a red pigment (azo metallic salt type red pigment), a green pigment (Phthalocyanine Green) and a blue pigment (Phthalocyanine Blue), respectively, were dispersed [their trade names are Shintron F-Red-C (red), Shintron F-Green-C (green) and Shintron F-Blue-C (blue), respectively; all manufactured by Shinto Chemitron Co.] were used. The electro-deposition was carried out at 50–80 V, for a period of 10–20 seconds, though the conditions of the coating process were dependent on the color. After thoroughly washing the resulting electro-deposited films with water, heat-treatment was carried out at 260° C. for one hour for the sake of baking. As a result, red-, green-and blue-colored films having a film thickness of 1.2 μm were formed in the prescribed order on the window parts (each window part had a width of about 80 μm) located on the transparent conductive circuits. These procedures illustrates step (d) of the present invention.

Through the steps described above, window-shaped color coating films on the conductive circuit and a frame-shaped, functional coating film (black, light-screening) at the regions not occupied with the window-shaped coating films could be formed on a transparent substrate having a plurality of conductive circuits on its surface. Optical microscopic observation (microscope: OPTIPHOT-88, manufactured by NIKON CORP.; magnification: 200) of the product revealed that no leakage of light occurred between the window-shaped, color coating films and the frame-shaped, functional coating film at the regions not occupied with the window-shaped coating films, and all the coating films were formed with high precision.

According to the method of the present invention, window-shaped coating films on the conductive circuits and a frame-shaped, functional coating film at the regions not occupied with the window-shaped coating films can be formed with high precision on a transparent substrate having a plurality of conductive circuits on its surface. Particularly, fine coating film patterns such as those in which the width of each window part is 100 μm or less can be formed with very high precision.

Thus, the method of the present invention is suitable for producing a color filter well prevented from the leakage of light, vivid in the colors of color parts and quite superior in optical properties, and particularly for producing the color filter used in the matrix type color display using TFT and color filters.

What is claimed is:

1. A method for manufacturing a substrate having electrically conductive circuits on the surface thereof, window-shaped colored coating films on the circuits and a frame-shaped, light-screening coating film at the regions not occupied with the window-shaped coating films, which comprises the steps of:

(a) coating a transparent substrate having more than one transparent, electrically conductive circuit on the surface thereof with a negative or positive photoresist composition capable of giving a light-screening coating film to cover the circuits-carrying surface of the substrate, followed by forming a light-screening coating film, (b) superposing, on the surface of the coating film formed through step (a), a photomask having a pattern designed so as to give in the following step (c) the coating film covering the frame-shaped part and uncovering the window-shaped parts, and exposing the thus masked coating film to light, (c) subjecting the resulting substrate formed through steps (a) and (b) to development, leaving the frame-shaped light-screening coating film and eliminating the coating film other than the frame-shaped light-screening coating film, (d) subjecting the resulting substrate formed through steps (a), (b) and (c) in this order to electro-deposition selecting less than all the circuits on the substrate as one electrode, forming at least one electro-deposition colored coating film at the window-shaped parts on the circuits, and (e) recovering a product comprising a transparent substrate having more than one transparent circuit thereon, frame-shaped light-screening coating film defining windows and at least one colored coating film within the windows.

2. The method according to claim 1, wherein the electrically conductive circuits are made of tin-doped indium oxide or antimony-doped tin oxide.

3. The method according to claim 1, wherein the negative or positive photoresist composition contains a black pigment.

4. The method according to claim 1, wherein the formation of the coating film in step (a) is carried out by heat-treatment at 60° to 100° C.

5. The method according to claim 1, wherein the exposure in step (b) is carried out using an ultraviolet ray at a light exposure of 10 to 500 mJ/cm$^2$.

6. The method according to claim 1, wherein the development in step (c) is carried out using a developing agent selected from aqueous alkaline solutions of caustic soda, sodium carbonate, quaternary ammonium salt and organic amines, and organic solvents.

7. The method according to claim 1, wherein the electro-deposition is effected by applying a direct current voltage of 10 to 300 V for 1 second to 3 minutes.

8. The method according to claim 1, wherein the electro-deposited coating films are colored with red, green and blue pigments, respectively, and the functional coating film has a function as a black matrix of color filter.

9. A method for manufacturing a color filter for use in a liquid crystal display, which comprises the steps of:

forming the substrate having the light-screening coating film and the electro-deposition coating films by the method of claim 1, forming an overcoat film on both the functional coating film and the electro-deposition coating films, and forming a transparent conductive film on the overcoat film.

* * * * *